(12) United States Patent
Sabih

(10) Patent No.: US 8,327,194 B1
(45) Date of Patent: Dec. 4, 2012

(54) NONVOLATILE RECORDING OF INTEGRATED CIRCUIT-RELATED DATA

(75) Inventor: Sabih Sabih, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 39 days.

(21) Appl. No.: 12/861,105

(22) Filed: Aug. 23, 2010

(51) Int. Cl.
*G06F 11/00* (2006.01)
(52) U.S. Cl. .............................. 714/45; 714/48; 714/49
(58) Field of Classification Search .................. 714/45, 714/48, 49
See application file for complete search history.

(56) References Cited

U.S. PATENT DOCUMENTS

| | | | |
|---|---|---|---|
| 7,365,644 B2 * | 4/2008 | Yang | 340/572.1 |
| 7,429,926 B1 | 9/2008 | Drimer | |
| 7,796,039 B2 * | 9/2010 | Brillhart et al. | 340/572.1 |
| 2005/0005204 A1 * | 1/2005 | Kobayashi | 714/48 |
| 2006/0236171 A1 * | 10/2006 | Hu et al. | 714/724 |
| 2008/0061980 A1 * | 3/2008 | Kean | 340/572.1 |
| 2009/0002164 A1 * | 1/2009 | Brillhart et al. | 340/572.1 |

OTHER PUBLICATIONS

Finkenzeller, Klaus, *RFID Handbook: Fundamentals and Applications in Contactless Smart Cards and Identification*, Apr. 2003, pp. 29-59, Wiley and Sons, Ltd., Indianapolis, Indiana, USA.
Smerdon, Maureen, *Security Solutions Using Spartan-3 Generation FPGAs*, WP266 (v1.0), Jul. 24, 2007, pp. 1-12, available from Xilinx, Inc., San Jose, California, USA.

* cited by examiner

*Primary Examiner* — Charles Ehne
(74) *Attorney, Agent, or Firm* — Thomas George

(57) ABSTRACT

An embodiment of the invention pertains to an integrated circuit that includes at least one data processing circuit that is configured to generate error data. The integrated circuit further includes a nonvolatile memory, and also a controller circuit that is coupled to the at least one data processing circuit and the nonvolatile memory. The controller circuit is configured to detect the error data. The controller circuit automatically initiates a write operation to store the error data in the nonvolatile memory in response to detecting the error data.

22 Claims, 7 Drawing Sheets

NONVOLATILE RECORDING OF INTEGRATED CIRCUIT-RELATED DATA

FIELD OF THE INVENTION

An embodiment of the invention relates to integrated circuits (ICs). More particularly, an embodiment of the invention relates to an IC to automatically record data.

BACKGROUND OF THE INVENTION

Integrated circuits ("ICs") include many types of devices, some of which have programmable logic on board that can be configured to perform specified logic functions. One type of integrated circuit with programmable logic is a programmable logic device ("PLD"). One type of PLD is the field programmable gate array ("FPGA"), which typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in nonvolatile memory. In some CPLDs, configuration data is stored on-chip in nonvolatile memory, then downloaded to volatile memory as part of an initial configuration (programming) sequence.

For all of these programmable logic devices ("PLDs"), the functionality of the device is controlled by configuration data bits provided to the device for that purpose. The data bits can be stored in volatile memory (e.g., static memory cells, as in FPGAs and some CPLDs), in nonvolatile memory (e.g., FLASH memory, as in some CPLDs), or in any other type of memory cell.

Semiconductor companies providing ICs such as PLDs have a responsibility of maintaining quality and reliability of their PLDs long after they leave the production test floor. End users may experience field failures or other malfunctions which may render the PLD inoperative. The cost of these failures is high both monetarily and also in terms of damaging the company's reputation for quality and reliability.

One way to mitigate the effects of PLD failures is to record PLD-specific data at various times during operation. However, since PLDs typically only contain static random access memory ("SRAM"), if the data is stored in the SRAM, then this data will be lost once the PLD is powered down. If the data is lost, then data, such as error data, cannot be used to mitigate the effects of the failure; for example, if the error data is lost, then the error data cannot be used to determine the reason for the PLD failure and resolve the bug or defect so that the failure does not reoccur.

For the foregoing reasons, it is desirable to record some types of data on an IC such that the data is not lost when the IC is powered down.

SUMMARY OF THE INVENTION

An embodiment of an integrated circuit includes at least one data processing circuit that is configured to generate error data. This embodiment of the integrated circuit further includes a nonvolatile memory, and a controller circuit that is coupled to the at least one data processing circuit and the nonvolatile memory. The controller circuit is configured to detect the error data. The controller circuit automatically initiates a write operation to store the error data in the nonvolatile memory in response to detecting the error data.

An embodiment of a method of automatically recording error data in a nonvolatile memory of an integrated circuit includes configuring a data processing circuit, and detecting at least one error data generated by the data processing circuit. This embodiment of the method further includes encoding the at least one error data to generate at least one encoded error data, and automatically storing the at least one encoded error data in the nonvolatile memory.

An embodiment of an integrated circuit package includes a first circuit configured to generate first data, and a second circuit, coupled to the first circuit, that is configured to wirelessly communicate second data to and from the integrated circuit package. This embodiment of the integrated circuit package further includes a non-volatile memory that is coupled to the first circuit and the second circuit. The non-volatile memory is configured to store at least the first data and manufacturing data. The second data includes at least the first data and the manufacturing data, and at least the second circuit is operable without a power source.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

An embodiment of the invention pertains to an IC to automatically record error data in nonvolatile memory so the error data is not lost when the IC is powered down. Because the error data is not lost, the error data can be retrieved and analyzed at a later time by, e.g., a field engineer. In this embodiment, the IC includes at least one data processing circuit and each of the at least one data processing circuit generates error data. The IC also includes a data storage system that includes the nonvolatile memory to store the error data, and also includes a controller circuit to detect the error data. In response to detecting the error data, the controller circuit automatically initiates a write operation to store the error data in the nonvolatile memory.

Figure 1A:
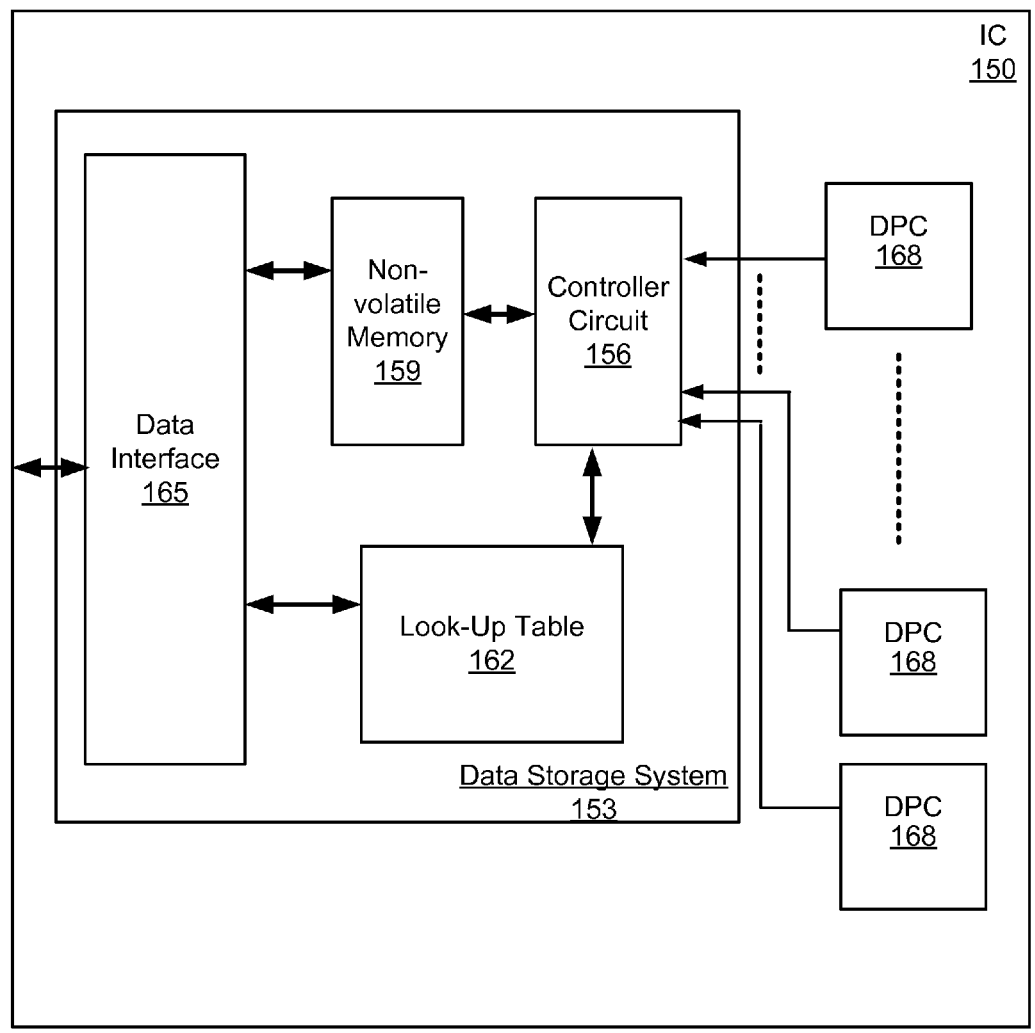
FIG. 1a shows a block diagram of an integrated circuit according to an embodiment of the present invention.

FIG. 1a shows an IC 150 according to an embodiment of the present invention. The IC 150 can be, e.g., a field programmable gate array ("FPGA"). The IC 150 includes at least one data processing circuits ("DPC") 168 which can be configured to generate an output such as error data and/or status data. In one example, each of the data processing circuits 168 can be an intellectual property ("IP") core that is configured using a portion of programmable resources such as configurable logic blocks ("CLBs") available in an integrated circuit such as the FPGA.

The nonvolatile memory 159 may be used to store error data and data other than error data; e.g., the nonvolatile memory 159 may store static manufacturing data such as the data processing circuit identification number that detected the error or error type.

FIG. 1a shows an IC 150 that includes a data storage system 153 that is coupled to the data processing circuits 168. The data storage system 153 includes a controller circuit 156, such as, e.g., an encoder, to receive output data, such as, e.g., error data or status data from the data processing circuits 168. The controller circuit 156 can encode the received output data based on an address assigned to the corresponding data processing circuit 168 which generates at least the error data or the status data. Alternatively, the controller circuit 156 can encode the received error data based on an input of the data storage system 153 on which the error data was received. In another example, the controller circuit 156 can automatically communicate with a look-up table 162. The look-up table 162 can encode the error data by categorizing the error data by determining if there is a match between the error data and the contents of the look-up table 162 which can be, e.g., error codes and/or status codes. The controller circuit 156 can arbitrate between multiple error data when multiple error data is detected simultaneously or almost simultaneously. The controller circuit 156 initiates multiple store operations, based on the results of the arbitration, in order to store the multiple error data in the non-volatile memory 159.

The controller circuit 156 is coupled to the look-up table 162 and bidirectional communication is possible. As described above, the look-up table 162 may include data (e.g., data such as error data, status data, or error codes) which is inputted by a user or it may include default configuration. The controller circuit 156 is also coupled to a memory such as, e.g., a nonvolatile memory 159 which stores data such as, e.g., error data and static data. In general, data stored in the nonvolatile memory 159 may be retrieved at anytime while the IC 150 is operating, and the stored data will be retained even after the power source is removed. The nonvolatile memory 159 can be, e.g., flash memory, battery-backed complementary metal-oxide semiconductor random access memory ("CMOS RAM"), and erasable programmable read-only memory ("EPROM"). The data can be written to the nonvolatile memory 159 so that the data can be analyzed at a later time by, e.g., a field engineer. A data interface 165 facilitates access to the data in the nonvolatile memory 159 from outside the IC 150. In addition, the data interface 165 facilitates access to the contents of the look-up table 162 from outside the IC 150.

Figure 1B:
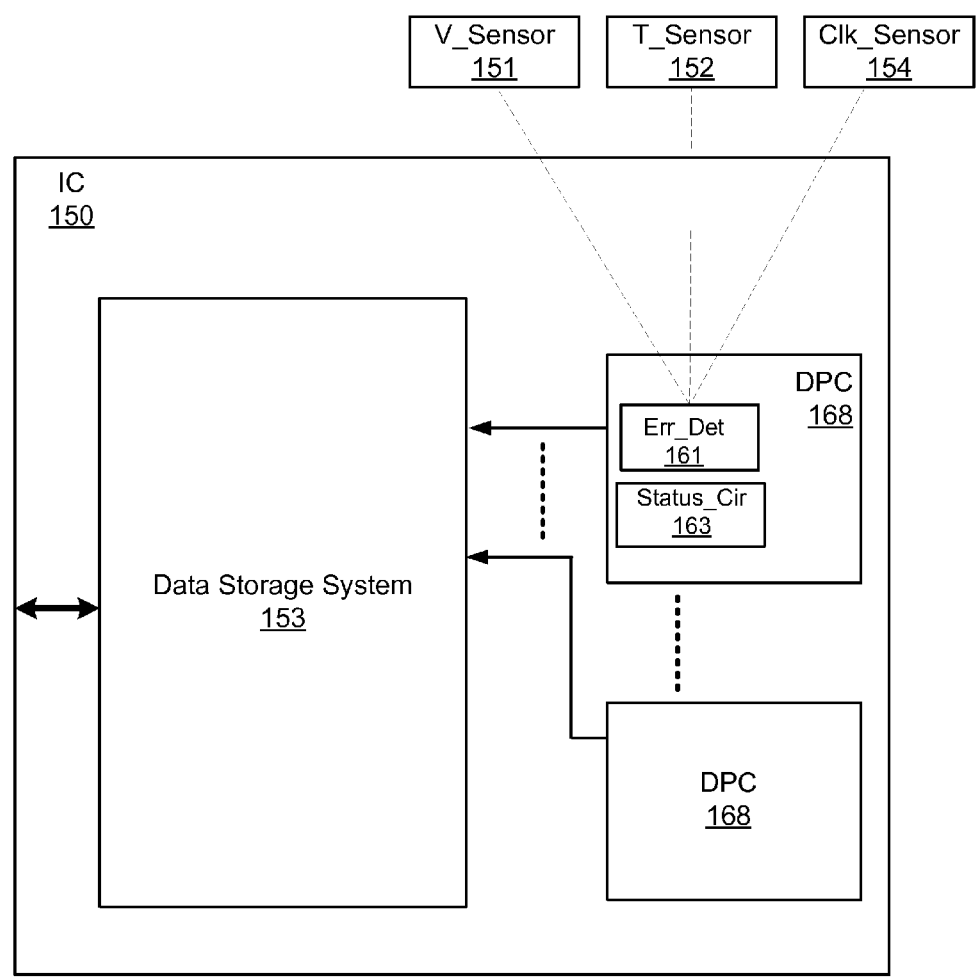
FIG. 1b shows a block diagram of an integrated circuit according to another embodiment of the present invention.

FIG. 1b is a block diagram of the IC 150 according to another embodiment of the present invention. Blocks in FIG. 1b that are the same or similar to blocks in FIG. 1a are labeled with identical reference numbers. Each of the data processing circuits 168 can include an error detection circuit 161 to detect an error within the corresponding data processing circuit 168 and also to generate error data based on the detected error. The error detection circuit 161 can be, e.g., a cyclical redundancy circuit ("CRC"), a voltage sensor circuit 151, a temperature sensor circuit 152, or a clock detector circuit 154. In another example, a combination of the above mentioned error detection circuits may be used in the IC 150. Persons skilled in the art may utilize other types of error detection circuitry that may aid in circuit debug and/or analysis.

In addition, each of the data processing circuits 168 can include a status circuit 163 to generate status data to provide status information for the corresponding data processing circuit 168. The status data can be, for example, status of the at least one data processing circuit 168 indicating whether the data processing circuit 168 is operating in normal mode, test mode, or has issued at least one error. In addition, the status data can be, e.g., details of the configuration data used to configure an IC such as an FPGA. The details of the configuration data can be, e.g., the version number of the configuration data. Moreover, the status data can be, e.g., the number of times the IC 150 (e.g., FPGA) was configured or partially reconfigured.

Figure 2:
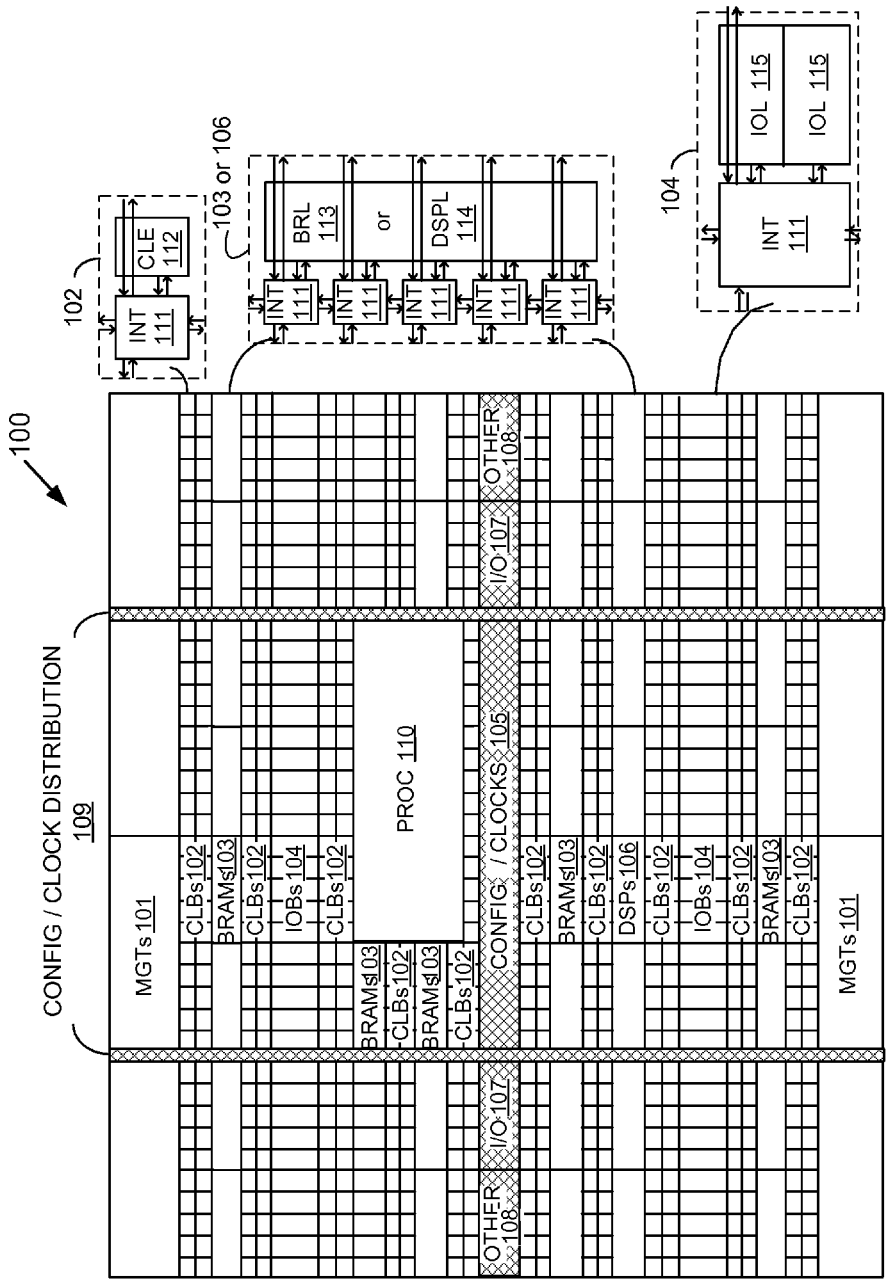
FIG. 2 shows a block diagram depicting a Field Programmable Gate Array ("FPGA") according to an embodiment of the present invention.

FPGAs are described below to provide specific examples, however, one or more embodiments of the invention are not limited to FPGAs but may include other types of ICs. FIG. 2 illustrates an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The INT 111 also includes the connections to and from the programmable logic element within the same tile, as shown by the examples included at the top of FIG. 2.

For example, a CLB 102 can include a configurable logic element ("CLE") 112 that can be programmed to implement user logic plus a single INT 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the INT 111. As will be clear to those of skill in the art, the actual I/O pads connected, for example, to the IOL 115 are manufactured using metal layered above the various illustrated logic blocks, and typically are not confined to the area of the IOL 115.

In the pictured embodiment, a horizontal area near the center of the FPGA 100 in FIG. 2 is used for configuration, clock, and other control logic. Vertical areas 109 extending from this horizontal area are used to distribute the clocks and configuration signals across the breadth of the FPGA 100. Some other FPGAs may include additional logic blocks that disrupt the regular columnar structure making up a large part of the FPGA. The additional logic blocks can be programmable blocks and/or dedicated logic.

Note that FIG. 2 is intended to illustrate only an exemplary FPGA. For example, the numbers of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

The data processing circuits 168 and the IP cores described above can be implemented by configuring the CLEs 112. In addition, the controller circuit 156, the look-up table 162, and the data interface 165 can also be implemented by configuring the CLEs 112. Regarding the nonvolatile memory 159 described above, the nonvolatile memory 159 may be implemented in the IC 150, e.g., integrated on the same substrate as the other blocks within the IC 150, or it may be stacked within the IC 150. Other examples include the nonvolatile memory 159 on a printed circuit board ("PCB"), or on an interposer designed to interface the nonvolatile memory 159 with the controller circuit 156 described above.

Figure 3:
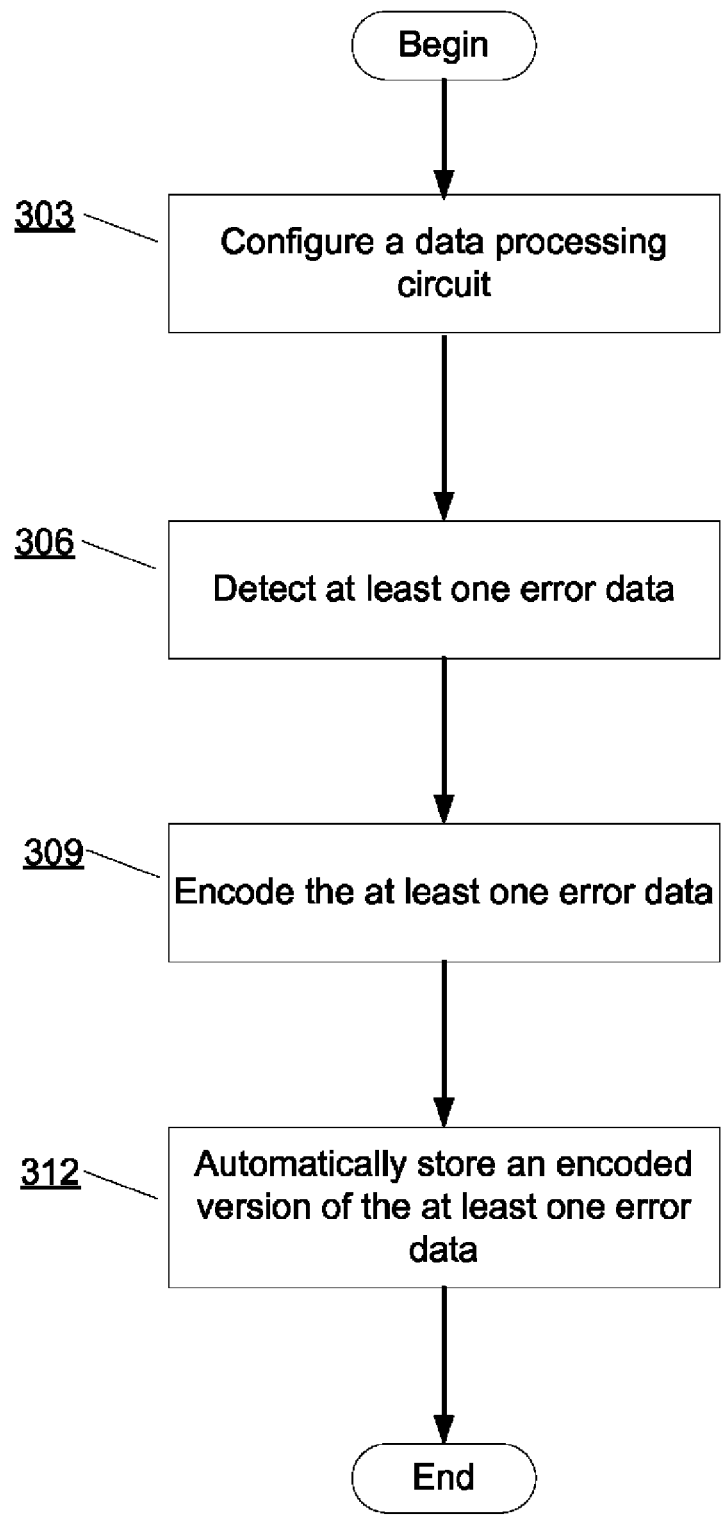
FIG. 3 shows a flow diagram showing a method to automatically record data in nonvolatile memory according to an embodiment of the present invention.

FIG. 3 is a flow diagram showing a method to automatically record data (e.g., the data can be error data or status data) in nonvolatile memory according to an embodiment of the present invention. In block 303, the data processing circuit 168 is configured within the integrated circuit 150. The process of configuring the data processing circuit 168 can include configuring a portion of a plurality of programmable resources (e.g., CLEs 112) of the integrated circuit (e.g., FPGA) to implement an IP core. In one example, the data processing circuit 168 can be configured to include an error detection circuit 161 and/or a status circuit 163.

In block 306, if the data processing circuit 168 generates at least one error data, then the at least one error data is detected by, e.g., the controller 156. The error data generated by the data processing circuit 168 can include, e.g., error data or status data. The error detection circuit 161 is capable of outputting encoded data that is specific to the data processing circuit 168. While the status circuit 163 is capable of outputting the status of the data processing circuit 168, e.g., if the data processing circuit 168 generates an error, then the output of the status circuit may also be asserted. The status circuit 163 may output status bits each having a significant relevance to the performance of the data processing circuit 168.

In block 309, the data is encoded by, e.g., the controller circuit 156. The data can be encoded based on an address assigned to the controller circuit 156, or based on an input of the data storage system 153 on which the data was received. In block 312, after encoding the data, the data can be automatically recorded or stored in the nonvolatile memory 159. The automatically storing of the data can include categorizing the data by determining if there is a match between the data and the contents (e.g., the contents can be, e.g., error codes and/or status codes) stored in the look-up table 162. For example, the controller circuit 156 may initiate a write operation based upon detecting the error data and/or the status data.

Figure 4A:
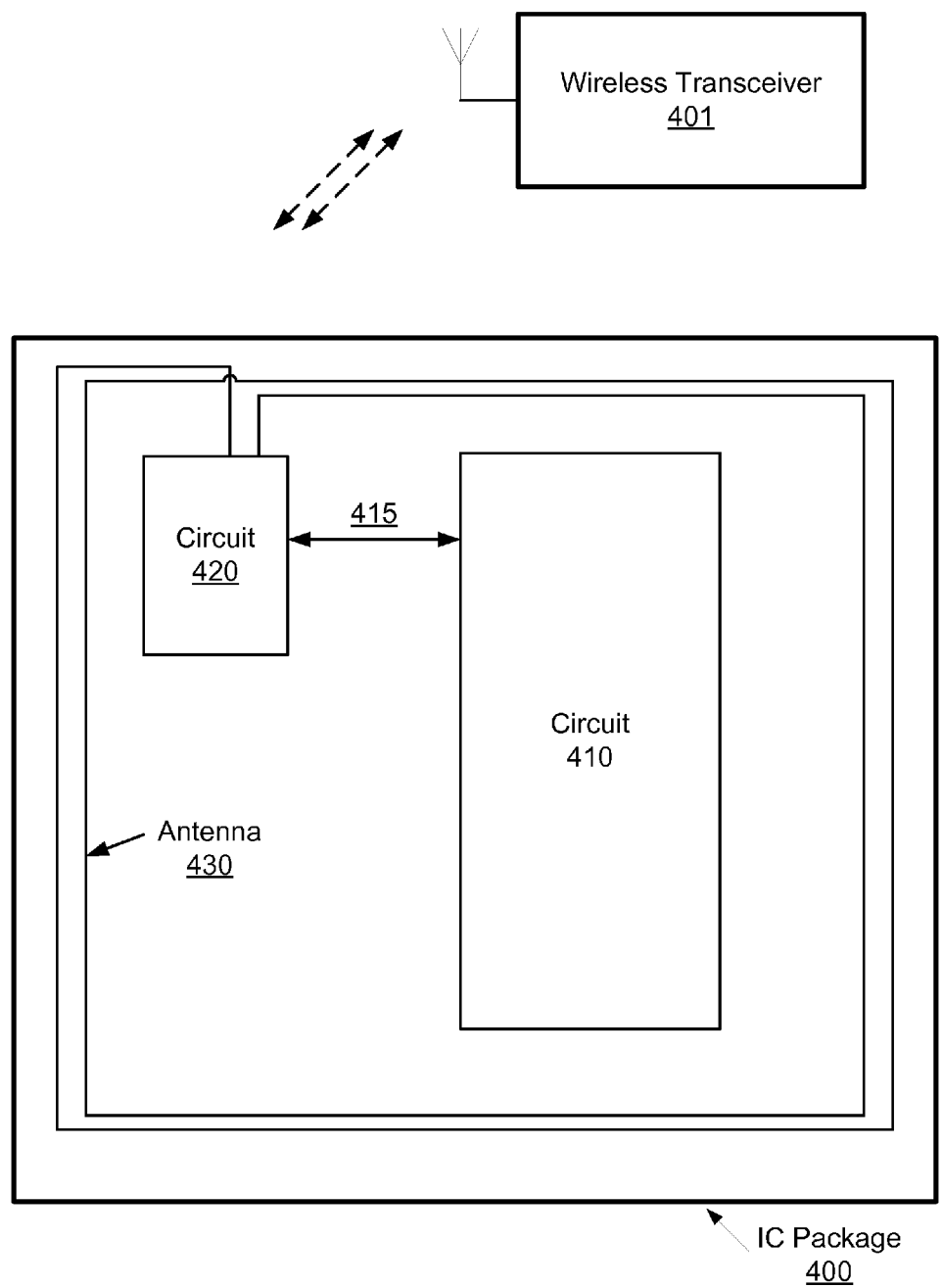
FIG. 4a shows a system that includes an IC package and a wireless transceiver according to an embodiment of the present invention.

FIG. 4*a* shows a system that includes an IC package 400 and a wireless transceiver 401 according to an embodiment of the present invention. The IC package 400 includes a circuit 410, a circuit 420, and an antenna 430. As shown in FIG. 4*a*, the circuit 410 and the circuit 420 communicate with one another bi-directionally via link 415. The circuits within the IC package 400 in FIG. 4*a* are for illustrative purposes and not meant as a limitation; the IC package 400 can include other additional circuits, components, or devices than those shown in FIG. 4*a*. In one example, the circuit 420 can be a radio-frequency identification ("RFID") circuit configured to communicate wirelessly with wireless transceiver 401. In general, an RFID circuit, also known as an RFID tag, is utilized for the purpose of identification and tracking using radio frequency. There are generally three types of RFID tags: (1) active RFID tags, which contain a battery and can transmit signals autonomously; (2) passive RFID tags, which have no battery and require an external source to provoke signal transmission (a passive RFID tag is operable without a power source); and (3) battery assisted passive ("BAP") RFID tags, which use an external source to wake-up but have significant higher forward link capability providing greater range. RFID tags are discussed in greater detail in the following which is incorporated by reference herein in its entirety: "RFID Handbook: Fundamentals and Applications in Contactless Smart Cards and Identification", Chapter 3, Klaus Finkenzeller, John Wiley & Sons, Ltd. (2003).

In one example, the IC package 400 wirelessly communicates data with the wireless transceiver 401 using the circuit 420. The data transmitted may include static manufacturing data of the IC package 400 and dynamic status data of the circuit 410. The dynamic status data can include error data generated by the circuit 410. In one example, the manufacturing data can include IC package identification number (e.g., part number), manufacturing date, operating conditions (e.g., voltage, temperature, and speed grade), and fabrication data. Storing such manufacturing data internal to the IC package 400 can significantly mitigate tampering. In general, manufacturing data is laser marked or stamped on the IC package 400, which is easy to erase, alter, and/or overwrite. The circuits shown in FIG. 4*a* offer a solution to reduce or even eliminate tampering with such important data.

Figure 4B:
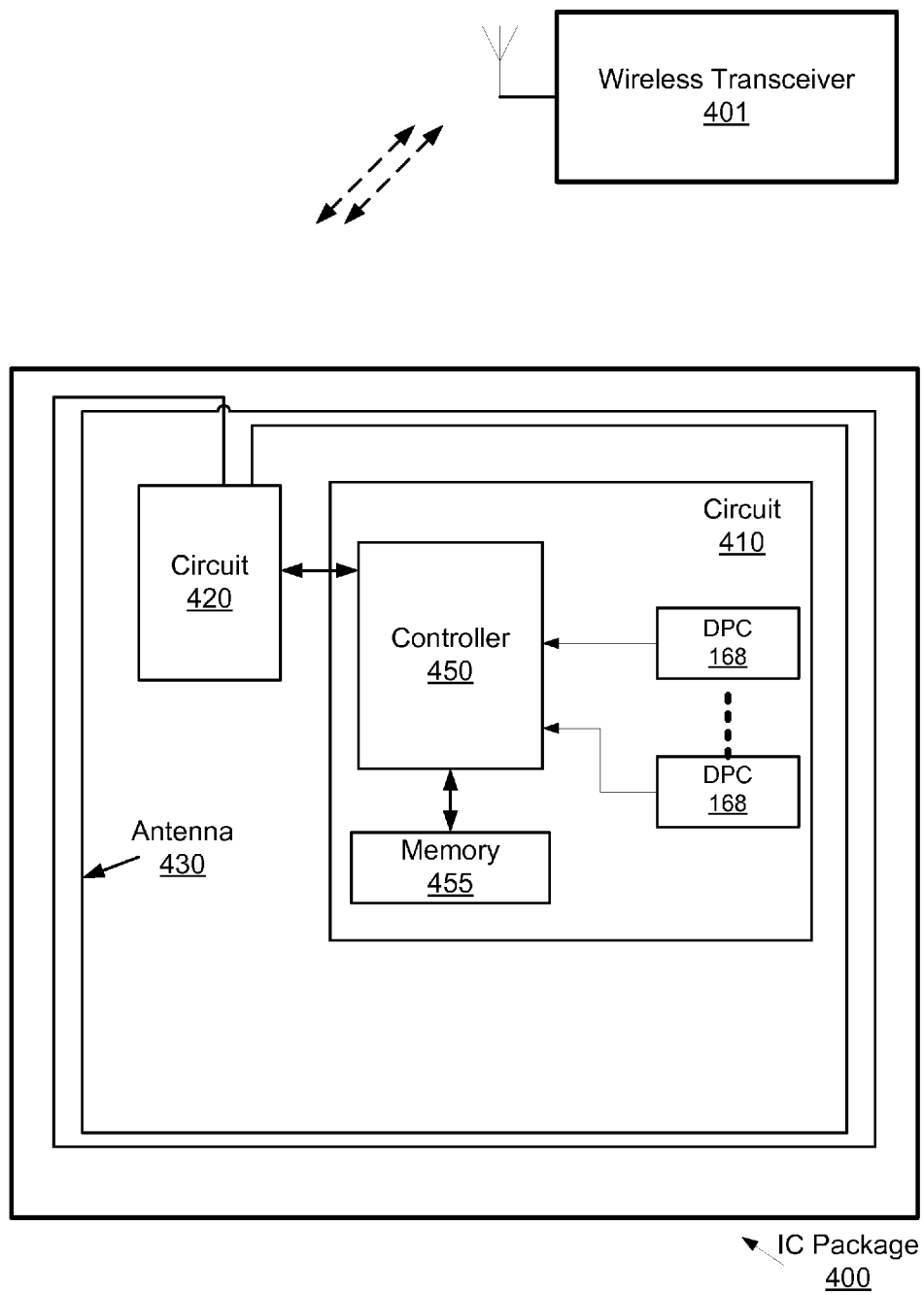
FIG. 4b shows a system that includes the IC package and the wireless transceiver according to another embodiment of the present invention.

FIG. 4b shows a system that includes the IC package 400 and the wireless transceiver 401 according to another embodiment of the present invention. In FIG. 4b, the IC package 400 includes the circuit 410 and the circuit 420; blocks in FIG. 4b that are the same or similar to blocks in FIG. 4a are labeled with identical reference numbers. In one example, circuit 410 includes controller 450, memory 455, at least one data processing circuit 168, and optionally sensors 151, 152, and/or 154. In another example, the memory 455 can be external to the circuit 410, and can be couped to both the circuit 420 and the circuit 410. In one example, the memory 455 may be a nonvolatile memory configured to include at least two partitions. The memory 455 can include manufacturing data stored in one dedicated partition, and another partition can store dynamic data of the IC package 400. The dynamic data content stored in memory 455 may be accessed from outside the IC package 400 wirelessly, and also the dynamic data can be wirelessly read and/or altered. In one example, the manufacturing data may only be written by an authorized user such as, e.g., a manufacturer of the IC package 400 and/or the company that designed the IC package 400. The manufacturing data can only be read after it has been written into the nonvolatile memory. For example, after the IC package 400 is tested and deemed ready for transfer to a customer, an authorized user with authentication code can configure the dedicated or protected portion of the memory 455 to include manufacturing data according to the specification of the IC package 400. In one example, the data stored in the nonvolatile memory, e.g., manufacturing data and error data, can be selectively accessed (e.g., read) via wireless transceiver but only the error data may be altered (e.g., full access is provided to the error data).

The unprotected portion of the memory 455 may be accessed by any user to read data, e.g., error data generated by one or more data processing circuits 168 of the IC package 400, or write user specific data related to an application or data related to the user. In one example, the data in the memory 455 may be encrypted. The controller 450 may be configured to include an encoder to encrypt data stored in the unprotected portion of the memory 400. The wireless transceiver 401 can be configured to decrypt data received from the IC package 400 via circuit 420. The wireless transceiver 401 may also be configured to encrypt data transmitted to the IC package 400 and ultimately to be stored in the unprotected portion of the memory 455.

Figure 5:
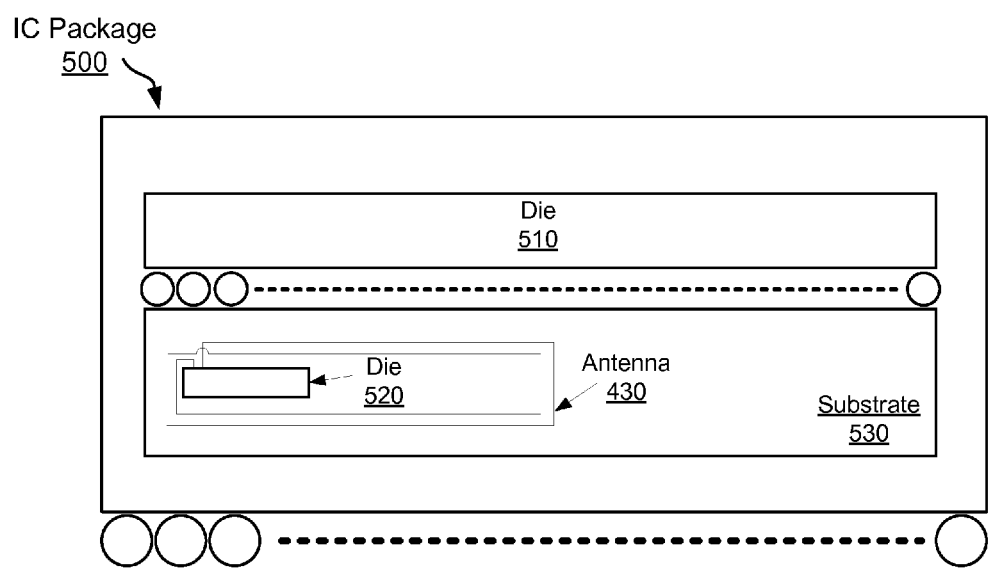
FIG. 5 shows an IC package according to yet another embodiment of the present invention.

FIG. 5 illustrates an IC package 500 that includes a die 510 and a die 520. The antenna 430 is encapsulated within the IC package 500. In FIG. 5, the die 520 and the antenna 430 are integrated within a substrate 530. In one example, the IC package 500 can be a Ball Grid Array ("BGA") package, and the die 520 can be a passive RFID tag coupled to the antenna 430. The antenna 430 can be placed on a single layer or in multiple layers, e.g., the layout and/or routing of the antenna 430 may be based on performance or area constraint, or other constraints well known to persons skilled in the art.

The die 510 can include at least one data processing circuit; for example, the die 510 can include at least one data processing circuit 168 configured to generate error data. The die 510 can be coupled to the substrate 530 using interconnects such as solder balls or wire bonding, or using any other interconnects well known to persons skilled in the art. The die 510 can be configured to communicate with the die 520 when the die 520 is a passive RFID tag configured to wirelessly transmit and receive data. Advantages of using the RFID tag within the IC package 500 are numerous; as described above, the RFID tag may transmit device manufacturing data, error data, and/or status data. In one example, the transmitted data includes error data generated by a sensor circuit such as, e.g., circuit 151, 152, or 154. The IC package 500 may not have any information displayed on the package or only include company logo displayed on the exterior of the package. This may be advantageous to mitigate tampering with the package information that is usually printed or laser marked on the package. Additionally, a user of the IC package can be assured that the package that they are using corresponds to application or design specifications, and this information will be available and transparent when the device is in use.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. For example, the data storage system 153 may be responsive to error data from the voltage sensor 151, the temperature sensor 152, and/or the clock sensor 154. Each of the above mentioned sensors may output error data based on acceptable operating parameters, which are configurable or preset by design. Claim(s) listing steps do not imply any order of the steps. Trademarks are the property of their respective owners.

What is claimed is:

1. An integrated circuit, comprising:
at least one data processing circuit configured to generate error data;
a nonvolatile memory;
a controller circuit, coupled to the at least one data processing circuit and the nonvolatile memory, configured to detect the error data,
wherein the controller circuit automatically initiates a write operation to store the error data in the nonvolatile memory in response to detecting the error data; and
a look-up table, coupled to the controller circuit, wherein the look-up table encodes the error data prior to the error data being stored in the nonvolatile memory.

2. The integrated circuit of claim 1, further comprising:
an interface circuit, coupled to the nonvolatile memory, wherein contents of the nonvolatile memory are accessed via the interface circuit.

3. The integrated circuit of claim 1, wherein:
the integrated circuit is a programmable logic device ("PLD") comprising a plurality of programmable resources;
a particular one of the at least one data processing circuit is an intellectual property ("IP") core that is configured using a portion of the plurality of programmable resources; and
the IP core includes an error detection circuit configured to detect an error within the IP core, and generate a corresponding error data based on the detected error.

4. The integrated circuit of claim 1, wherein:
the integrated circuit is a PLD comprising a plurality of programmable resources;
a particular one of the at least one data processing circuit is an IP core that is configured using a portion of the plurality of programmable resources; and
the IP core includes a status circuit configured to monitor the IP core during operation and generate status data.

5. The integrated circuit of claim 1, wherein the controller circuit comprises an encoder circuit to encode the error data, and wherein the nonvolatile memory includes an encoded version of the error data.

6. The integrated circuit of claim 3, wherein the error detection circuit is selected from a group consisting of a cyclical redundancy circuit ("CRC"), a voltage sensor circuit, a temperature sensor circuit, and a clock detector circuit.

7. The integrated circuit of claim 1, wherein the nonvolatile memory stores static data in a first partition of the nonvolatile memory and the error data in a second partition of the nonvolatile memory, and wherein the static data includes manufacturing data, and the static data is stored in the nonvolatile memory via the interface circuit, and wherein the first partition of the nonvolatile memory is a protected partition.

8. The integrated circuit of claim 1, wherein the controller circuit arbitrates between the error data and another error data generated by another one of the at least one data processing circuit.

9. A system, comprising:
the integrated circuit of claim 1;
another integrated circuit, coupled to the integrated circuit; and
an antenna, coupled to the other integrated circuit.

10. The system of 9, further comprising a wireless transceiver configured to wirelessly communicate with the other integrated circuit, wherein the other integrated circuit is a passive radio-frequency identification circuit.

11. A method of automatically recording error data in a nonvolatile memory of an integrated circuit, comprising:
configuring a data processing circuit;
detecting at least one error data generated by the data processing circuit;
encoding, using a look-up table, the at least one error data to generate at least one encoded error data; and
automatically initiating, by a controller circuit, a write operation to store the at least one encoded error data in the nonvolatile memory in response to detecting the at least one error data.

12. The method of claim 11, further comprising:
accessing the at least one encoded error data stored in the nonvolatile memory via an interface of the integrated circuit.

13. The method of claim 11, wherein configuring a data processing circuit comprises configuring a first portion of a plurality of programmable resources of the integrated circuit to implement an IP core.

14. The method of claim 11, wherein encoding the at least one error data comprises categorizing the at least one error data by determining a match between the at least one error data and a plurality of error codes programmed in a look-up table.

15. The method of claim 13, wherein detecting the at least one error data comprises configuring a second portion of the plurality of programmable resources to implement an error detection circuit within the IP core.

16. The method of claim 15, further comprising:
configuring a third portion of the plurality of programmable resources to implement a status circuit within the IP core.

17. The method of claim 11, further comprising:
wirelessly communicating data to and from the integrated circuit, wherein the data includes the at least one error data.

18. An integrated circuit package, comprising:
a first circuit configured to generate first data;
a second circuit, coupled to the first circuit, configured to wirelessly communicate second data to and from the integrated circuit package;
a non-volatile memory, coupled to the first circuit and the second circuit, configured to store at least the first data and manufacturing data,
wherein the second data includes at least the first data and the manufacturing data, and wherein at least the second circuit is operable without a power source; and
a substrate of the integrated circuit package, wherein an antenna and the second circuit are integrated within the substrate.

19. The integrated circuit package of claim 18, wherein the second circuit is a passive RFID circuit, and wherein the first circuit comprises:
at least one data processing circuit configured to generate the first data; and
a controller circuit, coupled to the at least one data processing circuit, configured to detect the first data.

20. The integrated circuit package of claim 19, wherein the non-volatile memory is partitioned into at least a first partition and a second partition, wherein the first partition is protected and the second partition is unprotected, and the passive RFID circuit selectively provides read only access to the first partition and full access to the second partition.

21. A system, comprising:
the integrated circuit package of claim 18; and
a wireless transceiver configured to wirelessly communicate the second data via the second circuit of the integrated circuit package.

22. The integrated circuit package of claim 18, wherein the integrated circuit package is a ball grid array, a first die comprises the first circuit, a second die comprises the second circuit, and the substrate comprises the second die and the antenna.

* * * * *